(12) United States Patent
Lai et al.

(10) Patent No.: US 9,741,731 B2
(45) Date of Patent: Aug. 22, 2017

(54) THREE DIMENSIONAL STACKED SEMICONDUCTOR STRUCTURE

(71) Applicant: MACRONIX INTERNATIONAL CO., LTD., Hsinchu (TW)

(72) Inventors: Erh-Kun Lai, Taichung (TW); Yen-Hao Shih, New Taipei (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 14/578,566

(22) Filed: Dec. 22, 2014

(65) Prior Publication Data

US 2016/0181269 A1 Jun. 23, 2016

(51) Int. Cl.
*H01L 27/11578* (2017.01)
*H01L 27/11524* (2017.01)
(Continued)

(52) U.S. Cl.
CPC .... *H01L 27/11578* (2013.01); *H01L 27/0207* (2013.01); *H01L 27/0688* (2013.01);
(Continued)

(58) Field of Classification Search
CPC ........... H01L 27/11578; H01L 27/0688; H01L 27/11551; H01L 27/1157; H01L 27/11524; H01L 29/792; H01L 27/249; H01L 27/10802; H01L 27/0207; H01L 27/11529; H01L 29/7841; H01L 29/785; H01L 27/2481; H01L 27/1211; H01L 27/1052; H01L 27/11568; H01L 29/66795; H01L 27/0886; H01L 29/42384; H01L 27/1214
(Continued)

(56) References Cited

U.S. PATENT DOCUMENTS 8,704,205 B2 * 4/2014 Chen ................. H01L 27/11548
257/208
8,890,233 B2 * 11/2014 Hung ................. H01L 27/0688
257/324

(Continued)

OTHER PUBLICATIONS

Hung, et al: "A Highly Scalable Vertical Gate (VG) 3D NAND Flash with Robust Program Disturb Immunity Using a Novel PN Diode Decoding Structure"; 2011 Symposium on VLSI Technology Digest of Technical Papers; pp. 68-69.

(Continued)

*Primary Examiner* — Shouxiang Hu
(74) *Attorney, Agent, or Firm* — McClure, Qualey & Rodack, LLP

(57) ABSTRACT

A 3D stacked semiconductor structure is provided, comprising a plurality of stacks vertically formed on a substrate and disposed parallel to each other, a dielectric layer formed on the stacks, a plurality of conductive plugs independently formed in the dielectric layer; and a metal-oxide-semiconductor (MOS) layer formed on the dielectric layer. One of the stacks at least comprises a plurality of multi-layered pillars, and each of the multi-layered pillars comprises a plurality of insulating layers and a plurality of semiconductor layers arranged alternately. The MOS layer comprises a plurality of MOS structures connected to the conductive plugs respectively, and function as layer-selectors for selecting and decoding the to-be-operated layer.

11 Claims, 7 Drawing Sheets

(51) Int. Cl.
*H01L 27/24* (2006.01)
*H01L 27/108* (2006.01)
*H01L 27/11551* (2017.01)
*H01L 27/11529* (2017.01)
*H01L 27/06* (2006.01)
*H01L 27/02* (2006.01)
*H01L 29/78* (2006.01)
*H01L 29/792* (2006.01)
*H01L 27/11565* (2017.01)
*H01L 27/1157* (2017.01)

(52) U.S. Cl.
CPC .... *H01L 27/10802* (2013.01); *H01L 27/1157* (2013.01); *H01L 27/11524* (2013.01); *H01L 27/11529* (2013.01); *H01L 27/11551* (2013.01); *H01L 27/11565* (2013.01); *H01L 27/249* (2013.01); *H01L 27/2481* (2013.01); *H01L 29/785* (2013.01); *H01L 29/7841* (2013.01); *H01L 29/792* (2013.01)

(58) Field of Classification Search
USPC ....... 365/185.17, 63, 72; 257/324, 773, 211, 257/686, 774, 67, 758
See application file for complete search history.

(56) References Cited

U.S. PATENT DOCUMENTS

| | | | |
|---|---|---|---|
| 8,937,292 B2* | 1/2015 | Bateman | H01L 27/2454 257/5 |
| 2011/0018051 A1* | 1/2011 | Kim | H01L 27/11575 257/324 |
| 2013/0003434 A1* | 1/2013 | Lue | H01L 29/792 365/51 |
| 2013/0267046 A1* | 10/2013 | Or-Bach | H01L 23/50 438/14 |

OTHER PUBLICATIONS

Chen, et al.: "A Highly Scalable 8-layer Vertical Gate 3D NAND with Split-page Bit Line Layout and Efficient Binary-sum MiLC (Minimal Incremental Layer Cost) Staircase Contacts"; IEDM12-21; © 2012 IEEE; pp. 1-4.

* cited by examiner

THREE DIMENSIONAL STACKED SEMICONDUCTOR STRUCTURE

BACKGROUND

Field of the Invention

The disclosure relates in general to a three-dimensional (3D) stacked semiconductor structure and method of manufacturing the same, and more particularly to the 3D stacked semiconductor structure having one metal-oxide-semiconductor (MOS) layer formed between the stacking cells and metal routes to serve layer selection and method of manufacturing the same.

Description of the Related Art

A nonvolatile semiconductor memory device is typically designed to securely hold data even when power is lost or removed from the memory device. Various types of nonvolatile memory devices have been proposed in the related art. Also, manufactures have been looking for new developments or techniques combination for stacking multiple planes of memory cells, so as to achieve greater storage capacity. For example, several types of multi-layer stackable NAND-type flash memory structures have been proposed. However, the typical 3D memory structure suffers from several problems.

FIG. 1 is a perspective view of part of a 3D stacked semiconductor structure, in particular, a 3D NAND memory array structure. The 3D stacked semiconductor structure includes an array region 11 and a fan-out region 13. The multilayer array is formed on an insulating layer, and includes a plurality of word lines 125-1 WL, . . . , 125-N WL conformal with the plurality of stacks. The plurality of stacks includes semiconductor strips 112, 113, 114, 115. Semiconductor strips in the same plane are electrically coupled together by stairstep structures, also referred to as bit line structures. Stairstep structures (pad structures/bit line pads) 102B, 103B, 104B, 105B terminate semiconductor 10 strips, such as semiconductor strips 102, 103, 104, 105. As illustrated, these stairstep structures 102B, 103B, 104B, 105B are electrically connected to different bit lines for connection to decoding circuitry to select planes within the array. The stack of semiconductor strips 102, 103, 104, 105 is terminated at one end by the stairstep structures 102B, 103B, 104B, 105B, passes through string selection line (SSL) gate structure 109, ground selection line (GSL) 127, word lines 125-N WL through 125-1 WL, ground selection line GSL 126, and terminated at the other end by a source line (obscured by other parts of figure). The stack of semiconductor strips 112, 113, 114, 115 is terminated at one end by the stairstep structures (pad structures/bit line pads) 112A, 113A, 114A, 115A, passes through SSL gate 25 structure 119, ground selection line GSL 126, word lines 125-1 WL through 125-N WL, ground selection line GSL 127, and terminated at the other end by source line 128. A source line 128 comprises a stack of several insulating layer (ex: oxide layers) and conductive layers (ex: such as polysilicon as gate material) arranged alternately. A contact holes is formed vertically to the stack and filled with conductors for connecting each of the conductive layers to outer circuits.

However, it is hard to fabricate the SSL (string selection lines) islands as shown in FIG. 1. When the size of the 3D stacked semiconductor structure is scaled down and more layers and tight pitches are required, the process window is narrow.

Additionally, a PNVG structure, another type of the 3D stacked semiconductor structure, has been proposed, and the reverse bias leakage of PN diode is critically important for the PNVG structure to avoid boosted channel potential leakage. The PNVG structure needs sophisticated operation wave form during decoding to prevent PN junction leakage, and a three-phase programming method has been proposed. However, the programming method is complicated, and P+/N formation is not easy to implement.

SUMMARY

The disclosure relates to a three-dimensional (3D) stacked semiconductor structure and method of manufacturing the same. According to the embodiment, one metal-oxide-semiconductor (MOS) layer is formed between metal routes and 3D stacking cells.

According to one embodiment of the present disclosure, a 3D stacked semiconductor structure is provided, comprising a plurality of stacks vertically formed on a substrate and disposed parallel to each other, a dielectric layer formed on the stacks, a plurality of conductive plugs independently formed in the dielectric layer; and a metal-oxide-semiconductor (MOS) layer formed on the dielectric layer. One of the stacks at least comprises a plurality of multi-layered pillars, and each of the multi-layered pillars comprises a plurality of insulating layers and a plurality of conductive layers arranged alternately. The MOS layer comprises a plurality of MOS structures connected to the conductive plugs respectively.

According to one embodiment of the present disclosure, a method of forming 3D stacked semiconductor structure is provided, at least comprising steps of forming a plurality of stacks vertically on a substrate and disposed parallel to each other, and one of the stacks at least comprising a plurality of multi-layered pillars, and each of the multi-layered pillars comprising a plurality of insulating layers and a plurality of conductive layers arranged alternately; forming a dielectric layer on the stacks; forming a plurality of conductive plugs independently in the dielectric layer; and forming a metal-oxide-semiconductor (MOS) layer on the dielectric layer, and the MOS layer comprising a plurality of MOS structures connected to the conductive plugs respectively. The MOS structures function as layer-selectors for selecting and decoding the to-be-operated plane/layer.

The disclosure will become apparent from the following detailed description of the preferred but non-limiting embodiments. The following description is made with reference to the accompanying drawings.

DETAILED DESCRIPTION

In the embodiments of the present disclosure, a three-dimensional (3D) stacked semiconductor structure and method of manufacturing the same are provided. According to the embodiments, one metal-oxide-semiconductor (MOS) layer is formed between the metal routes and the 3D stacking cells. In the embodiment, the MOS layer comprises a plurality of MOS structures as layer-selectors for selecting and decoding the to-be-operated plane/layer. Also, the 3D stacked semiconductor structures of the embodiments can be decoded with a simple and reliable method.

The embodiments of the present disclosure could be implemented in many different applications. For example, the embodiments could be applied to, but not limited to, a 3D PNVG (vertical-gate) type stacked semiconductor structure, or traditional finger VG type stacked semiconductor structure. The embodiments are provided hereinafter with reference to the accompanying drawings for elaborating the 3D stacked semiconductor structures of the disclosure and method of manufacturing the same. However, the present disclosure is not limited thereto. The descriptions disclosed in the embodiments of the disclosure such as detailed structures, manufacturing procedures and material selections are for illustration only, not for limiting the scope of protection of the disclosure.

Also, it is noted that not all embodiments of the invention are shown. Modifications and variations can be made without departing from the spirit of the disclosure to meet the requirements of the practical applications. Thus, there may be other embodiments of the present disclosure which are not specifically illustrated. It is also important to point out that the illustrations may not be necessarily be drawn to scale. Thus, the specification and the drawings are to be regard as an illustrative sense rather than a restrictive sense.

Figure 1:
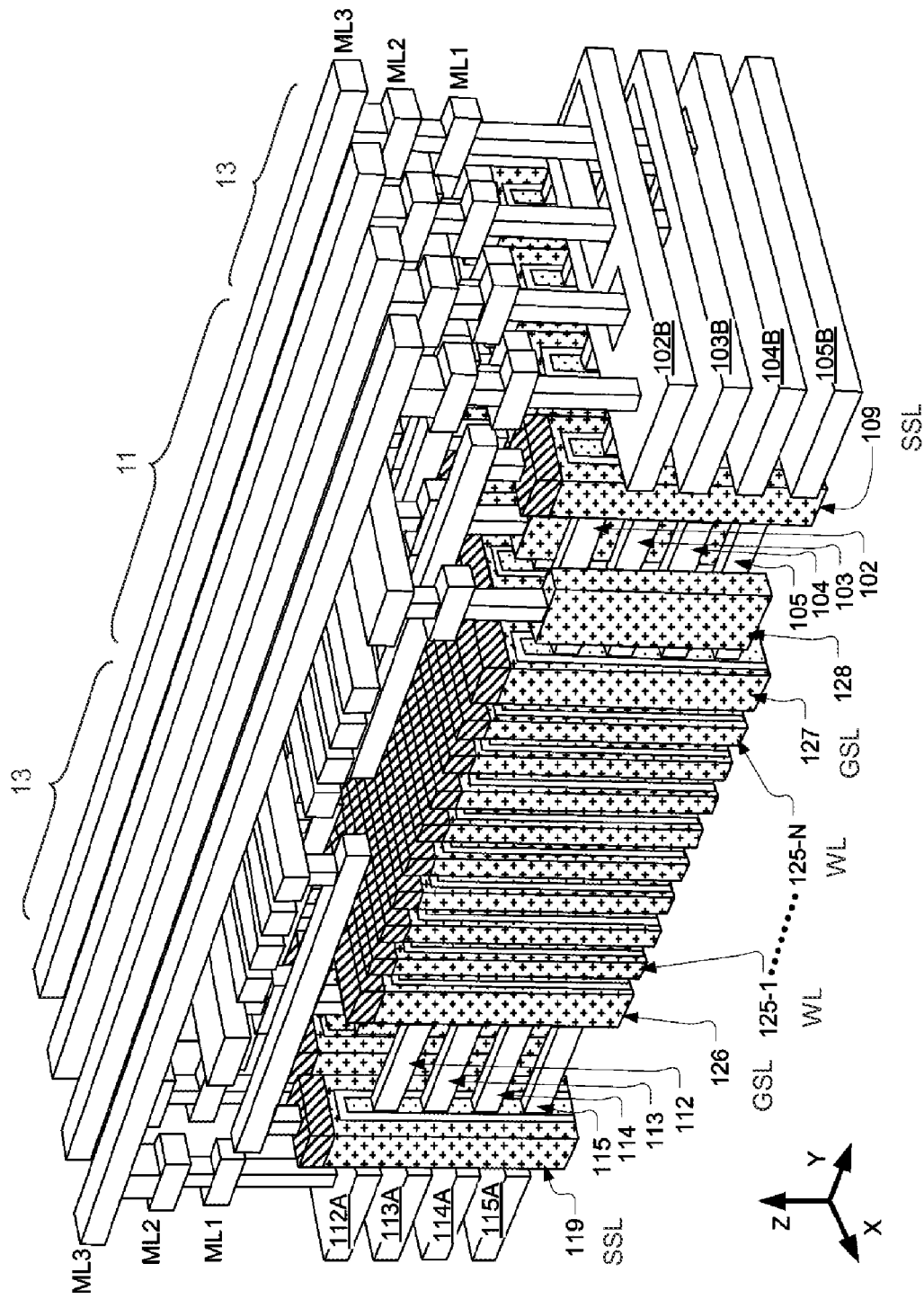
FIG. 1 (prior art) is a perspective view of part of a 3D stacked semiconductor structure.
Figure 2:
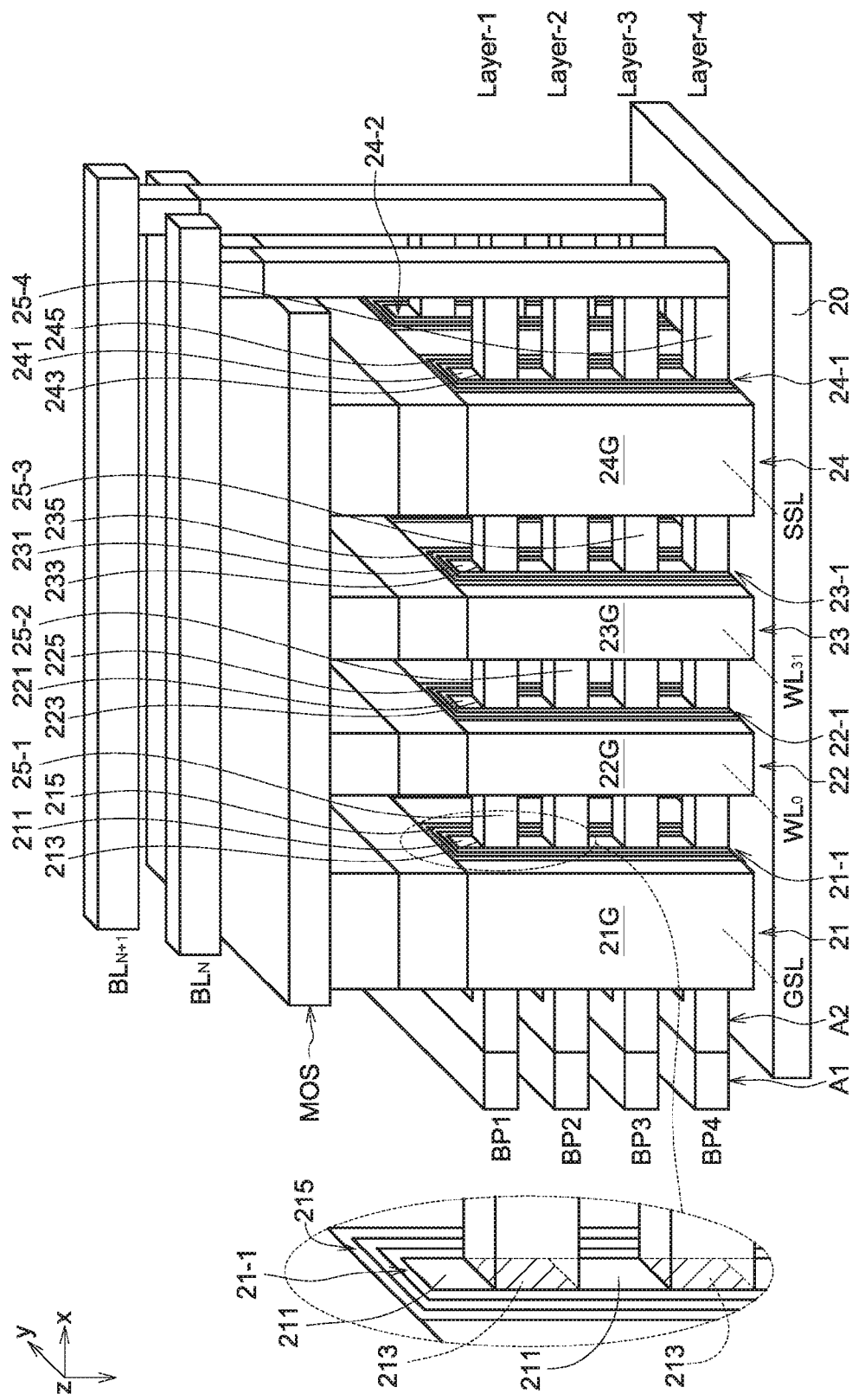
FIG. 2 illustrates a 3D stacked semiconductor structure according to an embodiment of the present disclosure.

In the following embodiment, a 3D stacked semiconductor structure similar to the PNVG structure is taken for exemplification, but the disclosure is not limited thereto. FIG. 2 illustrates a 3D stacked semiconductor structure according to an embodiment of the present disclosure. According to the embodiment, a 3D stacked semiconductor structure comprises a plurality of stacks 21, 22, 23, 24 formed on a substrate 20 and disposed parallel to each other, and one of the stacks 21, 22, 23, 24 at least comprises a plurality of multi-layered pillars (such as 21-1, 22-1, 23-1, 24-1, 24-2 shown in FIG. 2). Each of the multi-layered pillars comprises a plurality of insulating layers 211, 221, 231, 241 (such as oxide layers) and a plurality of conductive layers 213, 223, 233, 243 (such as polysilicon layers) arranged alternately. One pair of an insulating layer and a conductive layer positioned adjacently (such as the insulating layer 211 and the conductive layer 213) is known as an OP layer.

Also, one of the stacks 21, 22, 23, 24 comprises a plurality of charging trapping layers 215, 225, 235, 245 respectively formed at sidewalls of the multi-layered pillars (such as 21-1, 22-1, 23-1, 24-1, 24-2), and a plurality of gates 21G, 22G, 23G, 24G (as word lines WL, SSL and GSL) formed on the charging trapping layers 215, 225, 235, 245 and filling spaces between the adjacent charging trapping layers 215, 225, 235, 245 at the sidewalls of the multi-layered pillars (such as 21-1, 22-1, 23-1, 24-1, 24-2). The stacks 21, 22, 23, 24 and the gates 21G, 22G, 23G, 24G extend along the first direction (i.e. y-direction).

Also, the 3D stacked semiconductor structure of the embodiment comprises a plurality of semiconductor strips 25-1, 25-2, 25-3, 25-4, and each of the semiconductor strips 25-1, 25-2, 25-3, 25-4 extend along the second direction (i.e. x-direction), wherein the second direction is perpendicular to the first direction. As shown in FIG. 2, the semiconductor strips 25-1, 25-2, 25-3, 25-4 connect the conductive layers of the multi-layered pillars of different stacks at the same plane/layer. For example, the semiconductor strip 25-1 (along the x-direction) connects the conductive layers 213, 223, 233, 243 of the multi-layered pillars 21-1, 22-1, 23-1, 24-1 of different stacks 21, 22, 23, 24 at the same plane labeled as layer-1. Similarly, the semiconductor strip 25-2 connects the conductive layers 213, 223, 233, 243 of the multi-layered pillars 21-1, 22-1, 23-1, 24-1 of different stacks 21, 22, 23, 24 at the same plane labeled as layer-2; the semiconductor strip 25-3 connects the conductive layers 213, 223, 233, 243 of the multi-layered pillars 21-1, 22-1, 23-1, 24-1 of different stacks 21, 22, 23, 24 at the same plane labeled as layer-3, and the semiconductor strip 25-4 connects the conductive layers 213, 223, 233, 243 of the multi-layered pillars 21-1, 22-1, 23-1, 24-1 of different stacks 21, 22, 23, 24 at the same plane labeled as layer-4. It is noted that other semiconductor strips for connecting the conductive layers of the multi-layered pillars at the same plane and other multi-layered pillars exist but are not able to shown due to the drawing angle of FIG. 2.

Also, the 3D stacked semiconductor structure of the embodiment comprises a plurality of pad structures such as bit line pads BP1, BP2, BP3 and BP4 electrically connected to the semiconductor strips 25-1, 25-2, 25-3, 25-4, wherein the semiconductor strips 25-1, 25-2, 25-3, 25-4 in the same plane are electrically coupled together by one of the pad structures. For example, the semiconductor strips 25-1 in the same plane labeled as layer-1 are electrically coupled together by the bit line pad BP1; the semiconductor strips 25-2 in the same plane labeled as layer-2 are electrically coupled together by the bit line pad BP2; the semiconductor strips 25-3 in the same plane labeled as layer-3 are electrically coupled together by the bit line pad BP3; the semiconductor strips 25-4 in the same plane labeled as layer-4 are electrically coupled together by the bit line pad BP4.

In this exemplification similar to PNVG type of the 3D stacked semiconductor structure, a string selection line SSL (i.e. the stack 24) and ground selection line (GSL) (i.e. the stack 21) can be configured continuously. Also, and each of the pad structures such as bit line pads BP1, BP2, BP3 and BP4 comprises a first region A1 and a second region A2 connected to the first region A1. Noted that the disclosure is also applicable for other vertical-gate (VG) types of the 3D stacked semiconductor structures. The first region A1/the second region A2 could be N+ region/N region or P+ region/N region. In one embodiment, N+ region/N region are formed as the first region A1/the second region A2.

The 3D stacked semiconductor structure further comprises different layers of metal routes (such as the first metal layer ML1, the second metal layer ML2, the third layer ML3) stacked above the stacks 21, 22, 23, 24. According to the embodiment of the disclosure, one TFT metal-oxide-semiconductor (MOS) layer is inserted between the metal routes and the stacks 21, 22, 23, 24. In the embodiment, the MOS layer formed on a dielectric layer comprises a plurality of MOS structures as layer-selectors for selecting and decoding the to-be-operated plane/layer. The details are described thereafter.

In the embodiment, the doping types and concentrations of the first regions A1 and the second regions A2 of the bit line pads BP1, BP2, BP3 and BP4 are determined according to the MOS type formed on the stacks 21, 22, 23, 24. For example, if the MOS structures are NMOS structures, the first region A1 and the second region A2 of the bit line pads BP1, BP2, BP3 and BP4 are N+ region and N region, respectively (i.e. a doping concentration of the second region A2 is lower than that of the first region A1). Alternatively, if the MOS structures are PMOS structures, the first region A1 and the second region A2 of the bit line pads BP1, BP2, BP3 and BP4 are P+ region and N region (i.e. the first region A1 and the second region A2 are doped with different type dopants).

Figure 7:
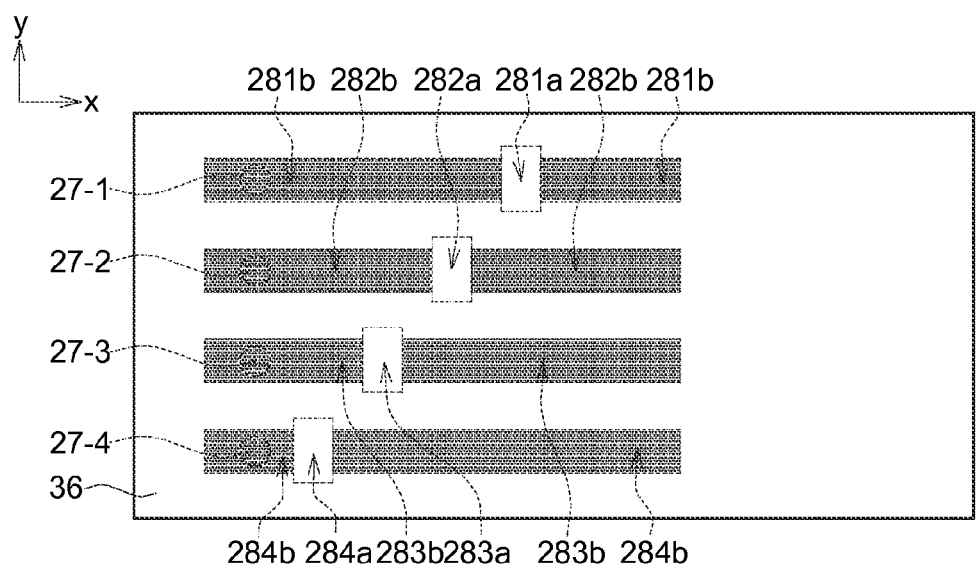
FIG. 7~FIG. 9 illustrate steps of forming metal routes formed on the MOS layer of FIG. 6 according to the embodiment.
Figure 8:
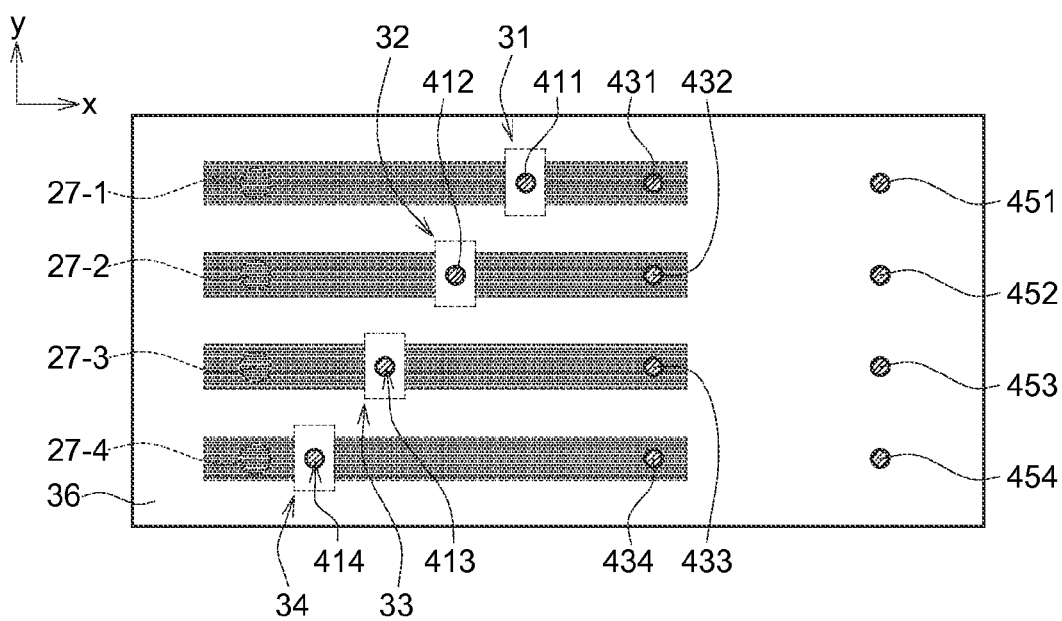
Figure 9:
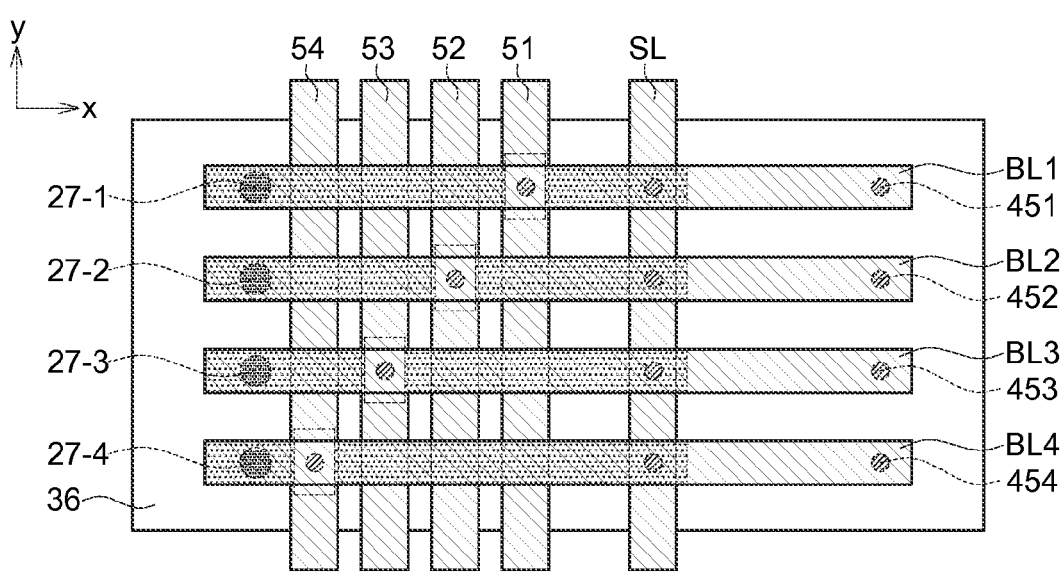

FIG. 3~FIG. 6 illustrate a method for manufacturing a MOS layer of a 3D stacked semiconductor structure according to an embodiment of the present disclosure. The MOS layer of the embodiment is positioned on the stacks 21, 22, 23, 24 as layer-selectors for selecting and decoding the to-be-operated plane/layer, and the metal routes are formed on the MOS layer. FIG. 7~FIG. 9 illustrate steps of forming metal routes formed on the MOS layer of FIG. 6 according to the embodiment. Please also refer to FIG. 2 for the perspective view of related elements of the 3D stacked semiconductor structure of the embodiment.

First, a substrate 20 (with a buried oxide) is provided, several stacks such as 21, 22, 23, 24 are formed vertically on the substrate 20, and each of the stacks 21, 22, 23, 24 comprises plural multi-layered pillars such as 21-1, 22-1, 23-1, 24-1, 24-2, and each multi-layered pillar comprises several insulating layers 211, 221, 231, 241 (such as oxide layers) and a plurality of conductive layers 213, 223, 233, 243 (such as polysilicon layers) arranged alternately (FIG. 2). One pair of an insulating layer and a conductive layer positioned adjacently (such as the insulating layer 211 and the conductive layer 213) is known as an OP layer. Each of the stacks comprises plural stacking cells, wherein several planes/layers (such as Layer-1, Layer-2, Layer-3, Layer-4) stacked vertically, and the cells of the stacks are arranged in a three-dimensional array. Also, the charging trapping layers (such as 215, 225, 235, 245) are respectively formed at sidewalls of the multi-layered pillars (such as 21-1, 22-1, 23-1, 24-1, 24-2), and the gates (such as 21G, 22G, 23G, 24G, as word lines WL, SSL and GSL), the semiconductor strips (such as 25-1, 25-2, 25-3, 25-4) and the pad structures (such as bit line pads BP1, BP2, BP3 and BP4) are formed, as shown in FIG. 2.

Figure 3:
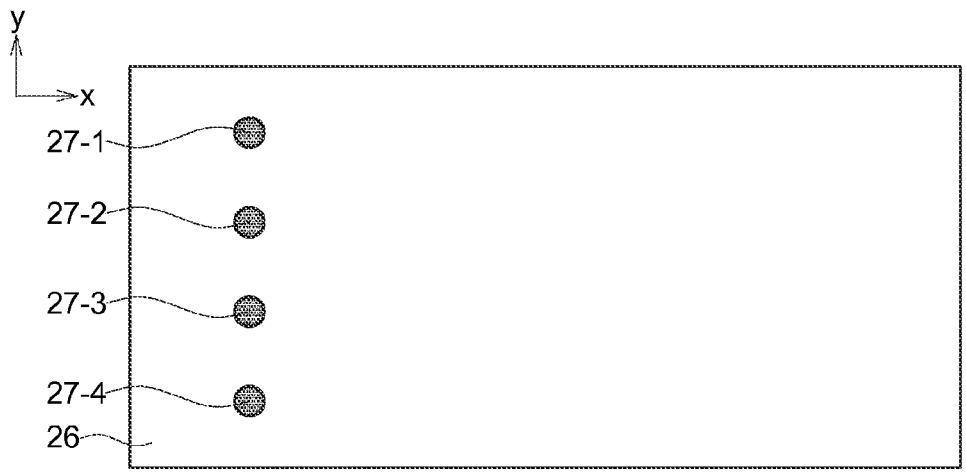
FIG. 3~FIG. 6 illustrate a method for manufacturing a MOS layer of a 3D stacked semiconductor structure according to an embodiment of the present disclosure.

A MOS layer is formed on the stacks (such as 21, 22, 23, 24). As shown in FIG. 3, a dielectric layer 26 such as oxide is formed on the stacks (such as 21, 22, 23, 24) as a dielectric planarization layer (to provide a planarizationed surface). Then, a plurality of conductive plugs such as 27-1, 27-2, 27-3, 27-4 are formed independently in the dielectric layer 26 along a third direction (i.e. z-direction), and positioned correspondingly to the bit line pads (such as BP1, BP2, BP3 and BP4) to reach different planes/layers (such as Layer-1, Layer-2, Layer-3, Layer-4). Those conductive plugs such as 27-1, 27-2, 27-3, 27-4 can be also referred as MiLC polysilicon plugs. In one embodiment, fabrications of the conductive plugs can be implemented by forming plug holes and filling N+ or P+ polysilicon in the plug holes, followed by chemical mechanical polishing (CMP) (stopped on the dielectric layer 26) or other suitable procedures for planarization. According to the embodiment, the MOS layer comprises plural MOS structures respectively connected to the conductive plugs such as 27-1, 27-2, 27-3, 27-4 function as layer-selectors.

The conductive plugs could be N+ polysilicon plugs or P+ polysilicon plugs. In one embodiment, if the MOS structures are NMOS structures, the conductive plugs such as 27-1, 27-2, 27-3, 27-4 would be N+ conductive plugs, wherein the first regions A1 and the second regions A2 of the pad structures (such as bit line pads BP1, BP2, BP3 and BP4) are N+ regions and N regions, respectively. In one embodiment, if the MOS structures are PMOS structures, the conductive plugs such as 27-1, 27-2, 27-3, 27-4 would be P+ conductive plugs, wherein the first regions A1 and the second regions A2 of the pad structures (such as bit line pads BP1, BP2, BP3 and BP4) are P+ regions and N regions, respectively.

Figure 4A:
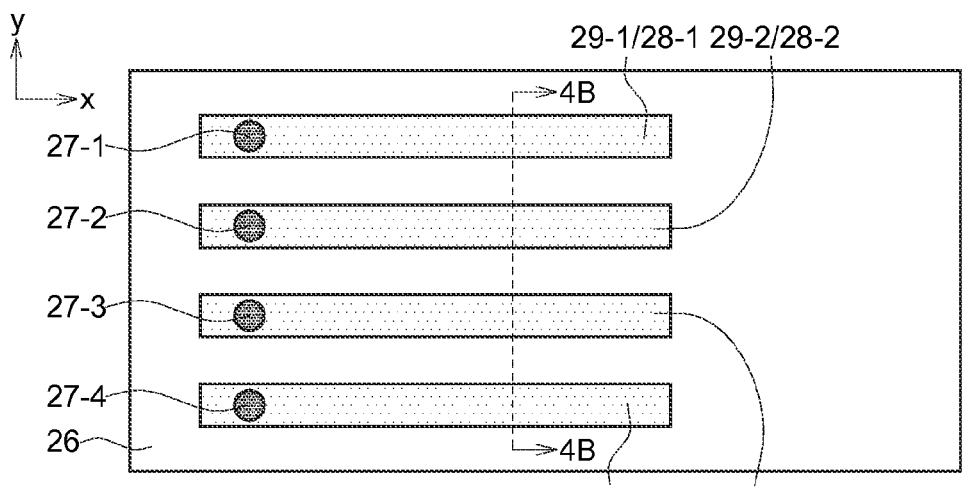
Figure 4B:
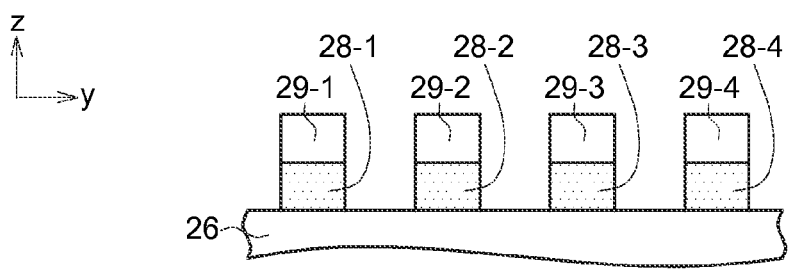

Afterward, fabrications of the MOS structures are conducted. First, plural patterned polysilicon layers 28-1, 28-2, 28-3, 28-4 are formed on the dielectric layer 26, and plural patterned oxide layers 29-1, 29-2, 29-3, 29-4 are formed on the patterned polysilicon layers 28-1, 28-2, 28-3, 28-4, as shown in FIG. 4A and FIG. 4B. FIG. 4B is a cross-sectional view of the patterned oxide layers and patterned polysilicon layers along the cross-sectional line 4B-4B of FIG. 4A. In FIG. 4A and FIG. 4B, four patterned strips (each containing a patterned oxide layer stacked on a patterned polysilicon layer) respectively connecting to (such as covering) the conductive plugs 27-1, 27-2, 27-3, 27-4 are exemplified for illustration. Fabrications can be implemented by depositing an undoped polysilicon, capping an oxide deposition (for double gate and hard mask purpose), followed by patterning.

Figure 5A:
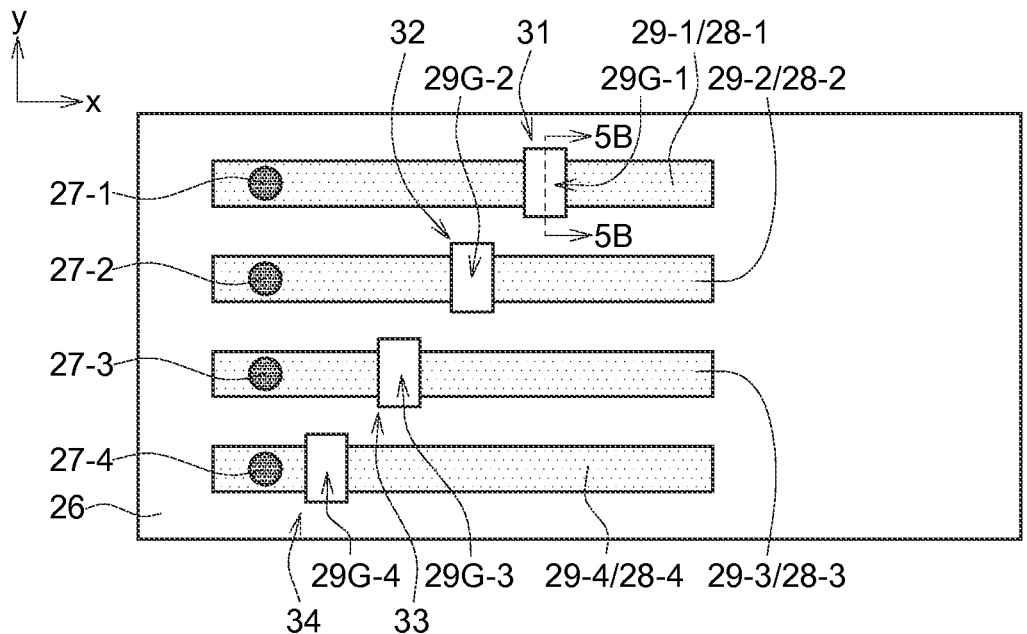
Figure 5B:
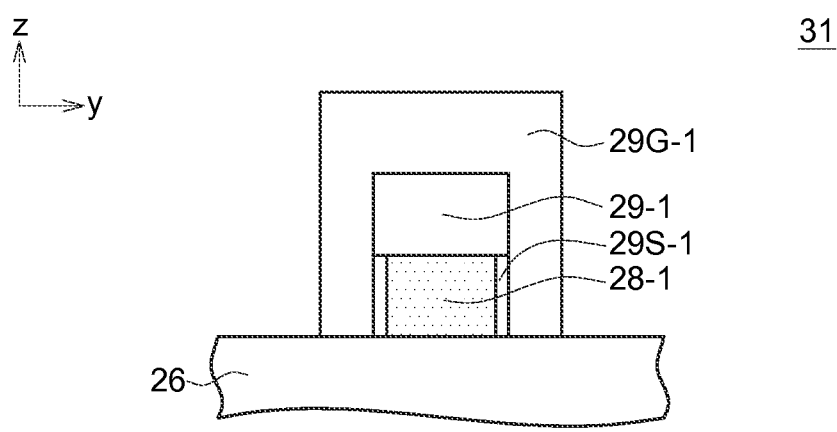

Then, plural island gates 29G-1, 29G-2, 29G-3, 29G-4 are formed, as shown in FIG. 5A. Please also refer to FIG. 5B, which is a cross-sectional view of the island gate 29G-1 along the cross-sectional line 5B-5B of FIG. 5A. Fabrications can be implemented by forming a gate oxide (GOX) (such as 29S-1) covering sidewalls of the patterned polysilicon layer (such as 28-1, 28-2, 28-3, 28-4), forming the patterned oxide layers (such as 29-1, 29-2, 29-3, 29-4) and depositing a polysilicon layer thereon, followed by island gate process. The island gates 29G-1, 29G-2, 29G-3, 29G-4 cover the patterned oxide layers and the gate oxides. Also, the island gates 29G-1, 29G-2, 29G-3, 29G-4 are isolated from each other; for example, the island gate 29G-1 is isolated to the island gates 29G-2, 29G-3 and 29G-4.

Figure 6:
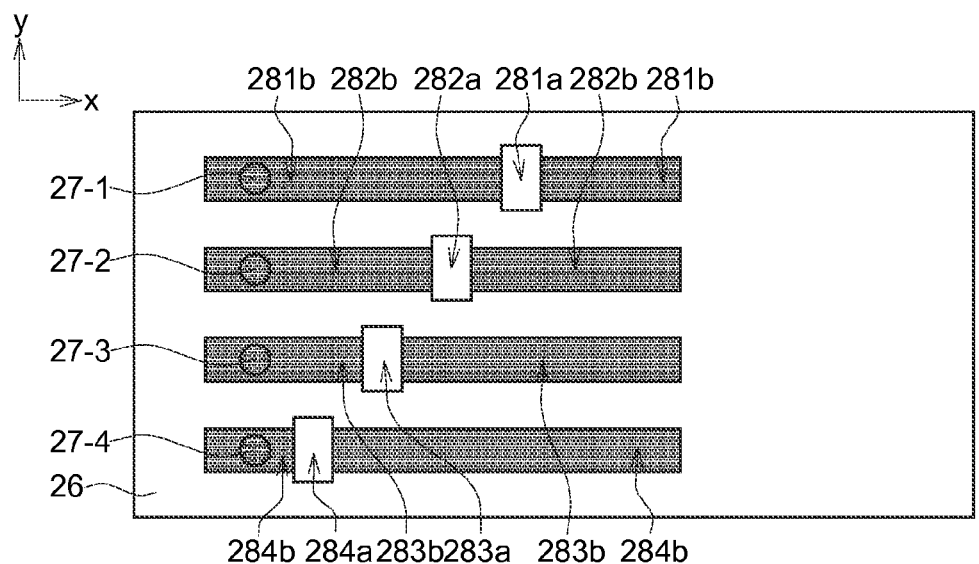

Subsequently, self-aligned S/D implantation is conducted, so that the portions (such as 281a, 282a, 283a, 284a) of the patterned polysilicon layers (such as 28-1, 28-2, 28-3, 28-4) shielded by the island gates (such as 29G-1, 29G-2, 29G-3, 29G-4) are undoped, and other portions (such as 281b, 282b, 283b, 284b) of the patterned polysilicon layer uncovered by the island gate is heavily doped, as shown in FIG. 6. Accordingly, the MOS structures 31, 32, 33, 34 are formed, and electrically connected to the conductive plugs 27-1, 27-2, 27-3, 27-4 through the heavily doped portion 281b, 282b, 283b, 284b of the patterned polysilicon layer 28-1, 28-2, 28-3, 28-4, respectively.

After formation of the MOS layer of the embodiment, several layers of metal routes are formed on the MOS layer. Please refer to FIG. 7~FIG. 9, which illustrate steps of forming metal routes on the MOS layer of FIG. 6 according to the embodiment. As shown in FIG. 7, an interlayer dielectric 36 is deposited, followed by CMP. Then, contacts for the island gates and the source line and the BL (bit line) contacts are formed. As shown in FIG. 8, several gate line contacts 411, 412, 413, 414 respectively formed on the island gates 29G-1, 29G-2, 29G-3, 29G-4 of the MOS structures 31, 32, 33, 34; several source line contacts 431, 432, 433, 434 respectively formed at the heavily doped polysilicon portions (ex: corresponding to the portions 281b, 282b, 283b, 284b) for connecting a source line; and several bit line contacts 451, 452, 453, 454 formed at the interlayer dielectric 36.

Next, different layers of metal routing above the MOS structures are constructed. As shown in FIG. 9, a plurality of layer-selector lines 51, 52, 53, 54 (ex: first metal lines M1) are respectively formed on the gate line contacts 411, 412, 413, 414 for electrical connection, and a source line SL is formed on the source line contacts 431, 432, 433, 434 for electrical connection. The layer-selector lines 51, 52, 53, 54 are parallel to each other and extend along the first direction (i.e. y-direction), and the source line SL is parallel to the layer-selector lines 51, 52, 53, 54. Then, a plurality of bit lines (ex: second metal lines) BL-1, BL-2, BL-3, BL-4 are insulatedly formed above the layer-selector lines 51, 52, 53, 54, as shown in FIG. 9. The bit lines BL-1, BL-2, BL-3, BL-4 extending along the second direction (i.e. x-direction) are perpendicular to the layer-selector lines 51, 52, 53, 54 and the source line SL.

According to the embodiment, only one layer process for manufacturing the MOS structures (such as 31, 32, 33, 34) of the MOS layer is required, regardless of the numbers of the OP layers, which simplifies the fabrication and enlarges the process window. The disclosure is more suitable for the 3D stacked semiconductor device with reduced size. Also, the decoding method of the 3D stacked semiconductor device of the embodiment is performed by selecting the word line (WL), the bit line (BL) and the top TFT (i.e. the MOS structure of the MOS layer for selecting the OP layer) to decode a 3DVG cell, which is simple and no special operation waveform to be considered.

Figure 10:
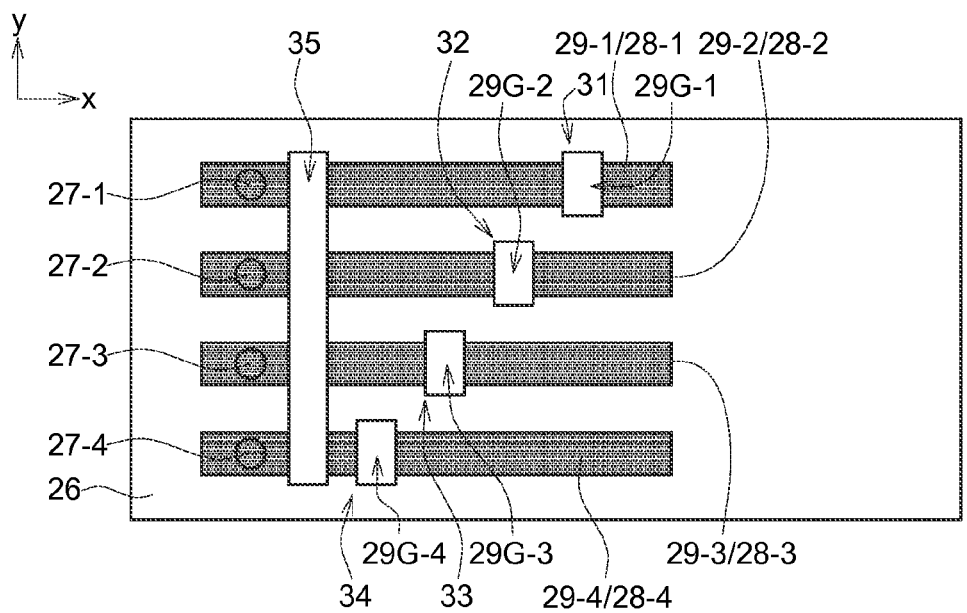
FIG. 10 and FIG. 11 illustrate the MOS layer and metal routes of the 3D stacked semiconductor device according to another embodiment of the disclosure, respectively.
Figure 11:
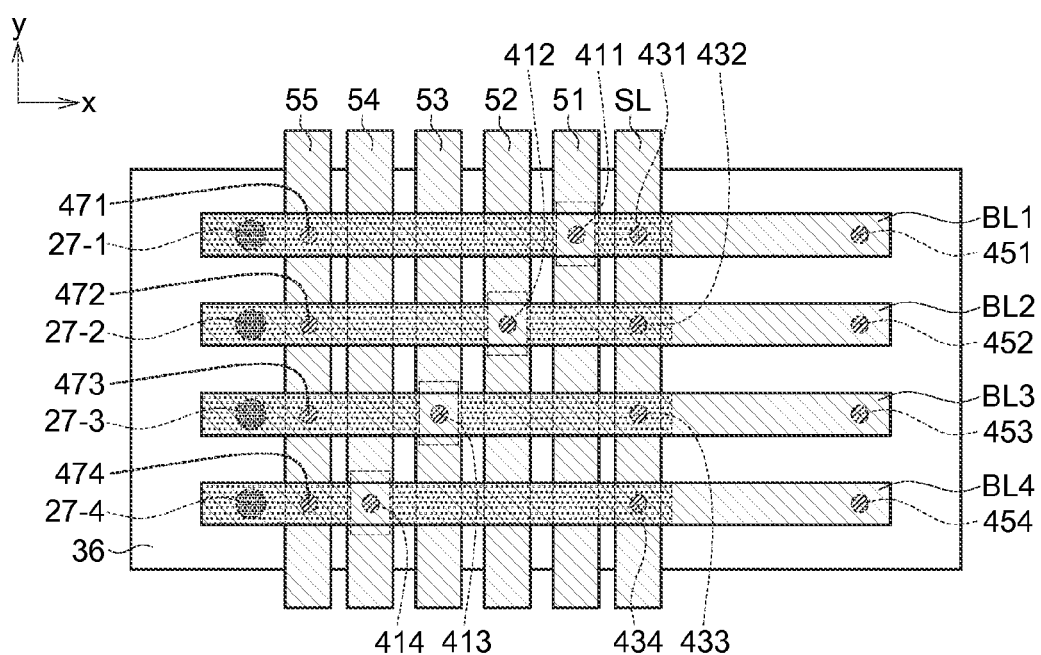

Additionally, optional process to reduce MiLC pad capacitance can be added to the 3D stacked semiconductor device of the embodiment. Typically, the capacitance of MiLC pad is larger, and it is necessary to charge each MiLC pad of the selected BL according to the conventional decoding method, and the total BL capacitance would be very large contributed by the numerous charged MiLC pads. According to the embodiment, each MiLC pad is controlled by one MiLC pad selector, and the total BL capacitance will be incredibly reduced. When the MiLC pad selector is on during decoding, only one MiLC pad is charged. FIG. 10 and FIG. 11 illustrate the MOS layer and metal routes of the 3D stacked semiconductor device according to another embodiment of the disclosure, respectively.

As shown in FIG. 10, the bit line pad selector 35 (i.e. MiLC pad selector for selecting the to-be-charged bit line pad) can be formed simultaneously with formation of the MOS structures (such as 31, 32, 33, 34). Please also refer to FIG. 5A and related descriptions of the MOS structures above. In one embodiment, structure of the bit line pad selector 35 is identical to the MOS structures (31, 32, 33, 34), and the details are not redundantly repeated. The bit line pad selectors 35 for selecting the to-be-charged bit line pads are perpendicular to the polysilicon stripes. Also, each of the bit line pad selectors 35 as shown in FIG. 10 can be coupled to the corresponding polysilicon stripes and formed between the corresponding conductive plugs 27-1, 27-2, 27-3, 27-4 and the MOS structures (31, 32, 33, 34).

Then, related contacts and several layers of metal routes are formed. Please also refer to FIG. 8 and FIG. 9. As shown in FIG. 11, plural bit line pad selector contacts 471, 472, 473, 474 are formed during formation of the gate line contacts 411, 412, 413, 414, the source line contacts 431, 432, 433, 434, and the bit line contacts 451, 452, 453, 454. Also, the bit line pad selector lines (such as 55) are formed on the bit line pad selector contacts (such as 471, 472, 473, 474) during formation of the layer-selector lines (such as 51, 52, 53, 54) and the source lines SL. During decoding, when the bit line pad selector 35 is on, only one corresponding bit line pad (i.e. MiLC pad) is selected to charge. According to the decoding method of this embodiment, the OP layer is selected via one of the MOS structures 31, 32, 33, 34, and one bit line pad is charged via one of the bit line pad selectors 35. Thus, the total BL capacitance of this embodied 3D stacked semiconductor structure can be greatly decreased.

According to the aforementioned embodiments, one MOS layer is formed between the metal routes and the 3D stacking cells. The MOS layer comprises plural MOS structures as layer-selectors for selecting and decoding the to-be-operated plane/layer. According to the embodiment, only one layer process for manufacturing the MOS structures of the MOS layer is required, regardless of the numbers of the OP layers, which simplifies the fabrication and enlarges the process window. Thus, the 3D stacked semiconductor structure of the embodiment not only possesses reliable electrical characteristics, but also is more suitable for the fabrication of small 3D stacked semiconductor device. Also, the decoding method of the 3D stacked semiconductor device of the embodiment is performed by selecting the word line (WL), the bit line (BL) and the top TFT (i.e. the MOS structure of the MOS layer for selecting the OP layer) to decode a 3DVG cell, and the decoding operation is very simple and reliable. Additionally, optional process to reduce MiLC pad capacitance can be added for greatly decreasing total BL capacitance of the 3D stacked semiconductor structure of the embodiment. Furthermore, the 3D stacked semiconductor structures of the embodiments adopt no time-consuming and expensive manufacturing procedures, which is suitable for mass production.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A 3D stacked semiconductor structure, comprising:
   a plurality of stacks formed on an identical surface of a substrate and disposed parallel to each other, and one of the stacks at least comprising a plurality of multi-layered pillars and a gate covering sidewalls of the multi-layered pillars, and each of the multi-layered pillars comprising a plurality of insulating layers and a plurality of semiconductor layers arranged alternately, wherein the multi-layered pillars in each of the stacks arranged along a first direction;
   a plurality of semiconductor strips extending along a second direction, and the semiconductor strips at an identical level connecting one of the semiconductor layers of the multi-layered pillars of different stacks at the identical level, wherein the second direction is perpendicular to the first direction, and the first direction and the second direction are parallel to the identical surface of the substrate;
   a plurality of pad structures electrically connected to the semiconductor strips, wherein the semiconductor strips at the identical level are electrically coupled together by one of the pad structures;
   a dielectric layer formed on the stacks;
   a plurality of conductive plugs independently formed in the dielectric layer; and
   a metal-oxide-semiconductor (MOS) layer formed on the dielectric layer and over the stacks, and the MOS layer comprising a plurality of MOS structures electrically connected to the conductive plugs respectively, each of the MOS structures comprising:
   a patterned polysilicon layer formed on the dielectric layer;
   a patterned oxide layer formed on the patterned polysilicon layer;

a gate oxide (GOX) covering sidewalls of the patterned polysilicon layer; and an island gate formed on the patterned oxide layer to cover the patterned oxide layer and the gate oxide, wherein the patterned polysilicon layer shielded by the island gate is undoped polysilicon, and the MOS structures are electrically connected to the conductive plugs through heavily doped polysilicon portions of the patterned polysilicon layers;

wherein the conductive plugs are respectively connected to the different pad structures, and the MOS structures respectively connected to the conductive plugs function as layer-selectors.

2. The 3D stacked semiconductor structure according to claim 1, wherein a string selection line (SSL) is configured continuously, and each of the pad structures comprises a first region and a second region connected to the first region.

3. The 3D stacked semiconductor structure according to claim 2, wherein when the first region is N+ region and the second region is N region, the MOS structures are NMOS structures and the conductive plugs are N+ conductive plugs.

4. The 3D stacked semiconductor structure according to claim 2, wherein when the first region is P+ region and the second region is N region, the MOS structures are PMOS structures and the conductive plugs are P+ conductive plugs.

5. The 3D stacked semiconductor structure according to claim 1, wherein said one of the stacks further comprises:
a plurality of charging trapping layers respectively formed at the sidewalls of the multi-layered pillars;
the gate formed on the charging trapping layers and filling spaces between the adjacent charging trapping layers at the sidewalls of the multi-layered pillars, and the gate extending along the first direction.

6. The 3D stacked semiconductor structure according to claim 5, wherein a string selection line (SSL) is configured as the gate.

7. The 3D stacked semiconductor structure according to claim 1, further comprising:
a plurality of gate line contacts respectively formed on the island gates of the MOS structures;
a plurality of source line contacts respectively formed at the heavily doped polysilicon portions; and
a plurality of bit line contacts formed at the dielectric layer.

8. The 3D stacked semiconductor structure according to claim 7, further comprising:
a plurality of layer-selector lines formed on the gate line contacts respectively, and the layer-selector lines parallel to each other and extending along the first direction;
a source line formed on the source line contacts, and the source line parallel to the layer-selector lines; and a plurality of bit lines insulatedly formed above the layer-selector lines, and the bit lines perpendicular to the layer-selector lines and extending along the second direction.

9. The 3D stacked semiconductor structure according to claim 1, wherein the MOS structures are electrically connected to the conductive plugs through polysilicon stripes formed on the dielectric layer correspondingly, and the MOS layer further comprises:
a plurality of bit line pad selectors formed perpendicular to the polysilicon stripes, and each of the bit line pad selectors coupling the corresponding polysilicon stripes and formed between the corresponding conductive plugs and the MOS structures.

10. The 3D stacked semiconductor structure according to claim 9, wherein each of the MOS structures comprises:
a patterned polysilicon layer formed on the dielectric layer;
a patterned oxide layer formed on the patterned polysilicon layer; and
an island gate formed on the patterned oxide layer to cover the patterned oxide layer, wherein the polysilicon layer shielded by the island gate is undoped polysilicon, and the MOS structures are respectively connected to the conductive plugs through the patterned polysilicon layers,
and, the 3D stacked semiconductor structure further comprises:
a plurality of bit line pad selector contacts formed on the bit line pad selectors;
a plurality of gate line contacts respectively formed on the island gates of the MOS structures;
a plurality of source line contacts respectively formed at heavily doped polysilicon portions of the patterned polysilicon layers and connecting to source lines;
a plurality of bit line pad selector lines formed on the bit line pad selector contacts for selecting bit line pads, and the bit line pad selector lines extending along a first direction;
a plurality of layer-selector lines formed on the gate line contacts respectively, and the layer-selector lines parallel to each other and extending along the first direction; and
a source line formed on the source line contacts, and the source line parallel to the layer-selector lines.

11. The 3D stacked semiconductor structure according to claim 10, further comprising:
a plurality of bit line contacts formed at the dielectric layer; and
a plurality of bit lines insulatedly formed above the bit line pad selector line and the layer-selector lines, wherein the bit lines are perpendicular to the bit line pad selector line and the layer-selector lines and extending along a second direction.

* * * * *